(12) United States Patent
Tabler et al.

(10) Patent No.: US 6,329,856 B1
(45) Date of Patent: Dec. 11, 2001

(54) METHOD AND APPARATUS FOR TRACKING AND CONTROLLING VOLTAGE AND CURRENT TRANSITIONS

(75) Inventors: John Tabler, San Jose; Kenneth C. Adkins, Fremont; Theodore M. Myers, Los Altos; Andrew Jenkins, San Jose, all of CA (US); Warren G. Hafner, Franklin, MA (US)

(73) Assignee: Summit Microelectronics, Inc., Campbell, CA (US)

( * ) Notice: Subject to any disclaimer, the term of this patent is extended or adjusted under 35 U.S.C. 154(b) by 0 days.

(21) Appl. No.: 09/649,263

(22) Filed: Aug. 28, 2000

(51) Int. Cl.$^7$ .............................. H03K 17/16; G05F 1/40
(52) U.S. Cl. ................................. 327/170; 323/266
(58) Field of Search ...................... 323/266, 267, 323/270, 271, 273, 282; 327/134, 170, 380, 381

(56) References Cited

U.S. PATENT DOCUMENTS

| | | | |
|---|---|---|---|
| 4,857,863 | * | 8/1989 | Ganger et al. ................ 330/264 |
| 5,675,558 | * | 10/1997 | Katoh ............................. 369/32 |
| 5,757,217 | * | 5/1998 | Thompson et al. ........... 327/170 |
| 5,939,909 | * | 8/1999 | Callahan, Jr. ................. 327/108 |
| 6,031,389 | * | 2/2000 | Fotouhi et al. ................ 326/31 |
| 6,066,971 | * | 5/2000 | Pappert et al. ................ 327/170 |

* cited by examiner

Primary Examiner—Matthew Nguyen
(74) Attorney, Agent, or Firm—Fernandez & Associates, LLP

(57) ABSTRACT

A method and apparatus for tracking and controlling one or more voltage and current supplies during a transition between and off-state to an on-state, or from an on state to an off-state, is enabled by detecting a voltage or current transition and controlling the voltage or current supply transition within a specified upper and lower limit about a reference transition.

18 Claims, 8 Drawing Sheets

METHOD AND APPARATUS FOR TRACKING AND CONTROLLING VOLTAGE AND CURRENT TRANSITIONS

BACKGROUND INFORMATION

1. Field of the Invention

The invention relates to the field of power supply monitoring and control. Specifically, the invention relates to tracking and controlling voltage and current supply transitions within specified boundaries from and active or inactive state.

2. Description of Related Art

Many integrated circuits (ICs), such as microprocessors, use a plurality of power supplies of various types and values (e.g., 5.0V, 3.3V, 1.8V) to operate. Power supplies such as regulated linear supplies and switching power supplies may be provided within the integrated circuits supporting circuitry. Additionally, power supplies may be external to the integrated circuits. For example, many power supplies and power supply conditioning circuits (e.g., DC-DC converters, linear regulators) are provided within a bus configuration where the power supplies and conditioning circuits are coupled to a back plane (e.g., "mother-board"). Circuit-card assemblies are then coupled to the bus configuration and are connected to the motherboard to receive power from the external power supplies. Many circuit-cards can then share the same external power supplies.

A rise in the current and voltage levels occurs as a power supply is activated from an off state. Additionally, a fall in the current and voltage levels occurs as a power supply is turned off from an active state. The transitory rise and fall of voltage and current is measured over time and defined as a slew-rate. Different power supplies and conditioning circuits may have different slew rates.

Many integrated circuits require that all of the power supplies and conditioning circuits used to supply the integrated circuit have slew rates within a specific designated range in order for the integrated circuit to operate correctly. Additionally, bus power supply configurations tend to load power supplies differently depending upon the number of circuit-cards attached, and impedance of the bus. Moreover, the variations of the number of circuit-cards on a bus, and bus-circuit impedance, make the slew-rate of the power supplies difficult to control at the inputs to the individual integrated circuits. Therefore, it is advantageous to supply configurable and adaptive voltages and currents in accordance to the requirements of the integrated circuit.

SUMMARY OF THE INVENTION

The invention enables a method for tracking and maintaining transitory voltages and currents between a first or more voltage and current supplies. The method comprising: providing at least a first supply transition, providing a reference transition comprising a defined slew-rate, measuring a differential value between the first supply transition and the reference transition, and maintaining the supply transition within a specific differential value about the reference.

In one embodiment, the present invention comprises an apparatus for tracking and maintaining transitory voltages between a first or more voltage and current supplies. The apparatus comprising: a plurality of detection inputs to receive at least a least one supply transition, a reference to provide a reference transition comprising a defined slew-rate, measuring logic to measure a differential value between the supply transition and the reference transition, and control output to control the supply transition within a specified differential value about the reference.

DETAILED DESCRIPTION OF THE INVENTION

Preferred embodiments of the invention include a method and apparatus for allowing the tracking and subsequent adjustment of the output voltage and current of power supplies and power conditioning circuits.

Figure 1:
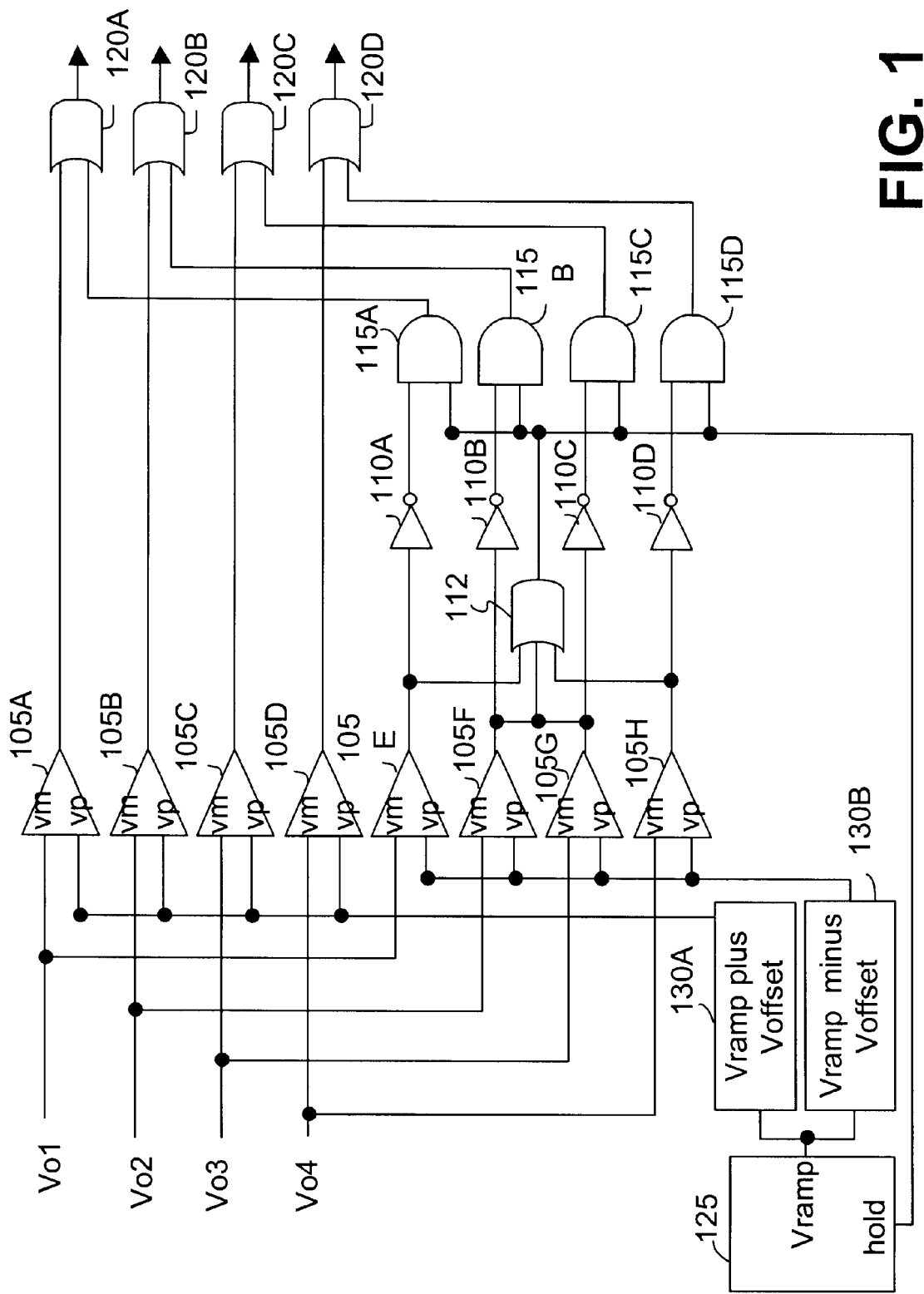
FIG. 1 is a simplified system diagram illustrating functional components of a tracking device relevant to the present invention.

FIG. 1 illustrates a hardware configuration of a tracking device. Each of the inputs of comparators 105A–105H comprises a Vm (V measured) input, a Vr (Vramp) input, and a Vh (Vhold) output. In a preferred embodiment, when the input value Vm is greater than input value Vr, output Vh goes high. In this embodiment, up to four supplies are tracked and monitored during transition to a final on-state value, or off-state value. The Vm input of comparators 105A–105D is coupled to one respective power supply voltage Vo1–Vo4. The Vm input of comparators 105E–105H is coupled to respective power supply voltages Vo1–Vo4. For example, Vo1 is coupled to the Vm input of comparators 105A and 105E.

Voltage ramp source 125 comprises a voltage ramp output and input for a voltage ramp hold signal. Coupled to the voltage ramp output source 125 are offset voltage sources 130A and 130B. Offset voltage source 130A adds an adjustable voltage offset, Voffset-A, to the voltage ramp. Offset voltage source 130B subtracts an adjustable voltage offset, Voffset-B, to the voltage ramp. The ramp hold input of voltage ramp source 125 is coupled to a first input of AND gates 115A–115D. When brought to a high state, the ramp hold input of ramp source 125 holds the ramp voltage value constant.

A first, second, third, and fourth input to OR gate 112 is coupled to the respective Vh output of comparators 105A–H. A first input of inverters 110A–110D are connected to the respective Vh output of comparators 105E–105H. An inverted output of inverters 110A–110D is coupled to a respective second input of AND gates 115A–115D. The output of AND gates 115A–115D are coupled to a respective first input of OR gates 120A–120D. Additionally, the outputs of comparators 105A–105D are coupled to a respective second input of OR gates 120A–120D.

When the tracking device is enabled, voltage ramp source 125 is activated producing a voltage ramp comprising a desired slew-rate and predetermined adjustable end voltage value. About simultaneously, a supply voltage (e.g., Vo1–Vo4) is turned on. The voltage ramp is inputted to offset source 130A and 130B. The voltage ramp plus Voffset-A is impressed upon the Vr inputs of comparators 105A–105D. The voltage ramp minus Voffset-B is impressed upon the Vr inputs of comparators 105E–105H.

In a preferred embodiment, if the supply voltage (e.g., Vo1–Vo4) is less than the voltage ramp plus Voffset-A, then Vh for the associated comparator 105A–105D is low. If the supply voltage (e.g., Vo1–Vo4) is greater than the voltage ramp minus the offset voltage Voffset-B, then Vh for the associated comparator 105E–105H is low.

If the supply voltage (e.g., Vo1–Vo4) is greater than the voltage ramp plus Voffset-A, then Vh for the respective comparator 105A–105D Vh is high. If the supply voltage (e.g., Vo1–Vo4) is less than the voltage ramp minus Voffset-B, then Vh for the associated comparator 105E–105H is high.

If OR gate 112 receives a high from any of the comparators 105E–105H the output of OR gate 112 goes high. Upon receiving a high signal from respective comparators 105E–105H, inverters 110A–110D inverts the high signals to low signals. Each AND gate 115A–115D upon receiving a high output from OR gate 112 at a first input and a high signal at a second input from the respective inverters 110A–110D and will subsequently produce a high output. OR gates 120A–120D upon receiving a high value from comparators 105A–105D, or AND gates 115A–115D, will output high. Each output of OR gates 120A–120D is coupled to a respective Vgs supply voltage control circuit 125A–125B. For example, OR gate 120A controls the output voltage of Vo1 through the associated Vo1 Vgs supply control circuit 125A. OR gates 120B–D control associated supplies Vo2–Vo4. When the output of the OR gates 120A–D are high, the voltage of a supplies Vo1–Vo4 is held constant by the associated Vgs supply control circuit 125A–D. For example, during turn-on of the supply Vo1, if OR gate 120A is placed in an output high state, the voltage value of Vo1 reached is held constant (between about 0V to final value of the power supply (e.g., 5V)). Subsequently, when the output of OR gate 120A is set to an output low state, the voltage Vo1 continues toward the final value.

The comparators 105A–H form the voltage and current supply detection section of the tracking circuit. The AND gates 115A–D, OR gate 112, and inverters 110A–D form the track logic portion of the tracking circuit. The OR gates 120C–D in conjunction with the supply control circuits 125A–D form the output control section of tracking circuit. The voltage ramp 125 provides the reference portion of the tracking circuit.

FIG. 1 is only one hardware configuration for the tracking device. A preferred embodiment of the invention can apply to any comparable hardware configuration. For example the comparators 105A–H can be from any class of open loop devices having a differential comparison input devices such as op-amps. Moreover, the AND gates and Or gates and comparators may be replaced by alternative discrete and integrated circuitry providing the same functions individually or as a whole.

One skilled in the art should recognize that the tracking device illustrated in FIG. 1 could be expanded as needed to facilitate the monitoring of as many supply voltages and currents as necessary. Moreover, the tracking Vgs supply control circuitry (125A–D) can be in the form of discrete transistor devices such as PNP, NPN, MOSFET, and other devices adapted to hold supply voltages and currents at a given state.

Figure 2:
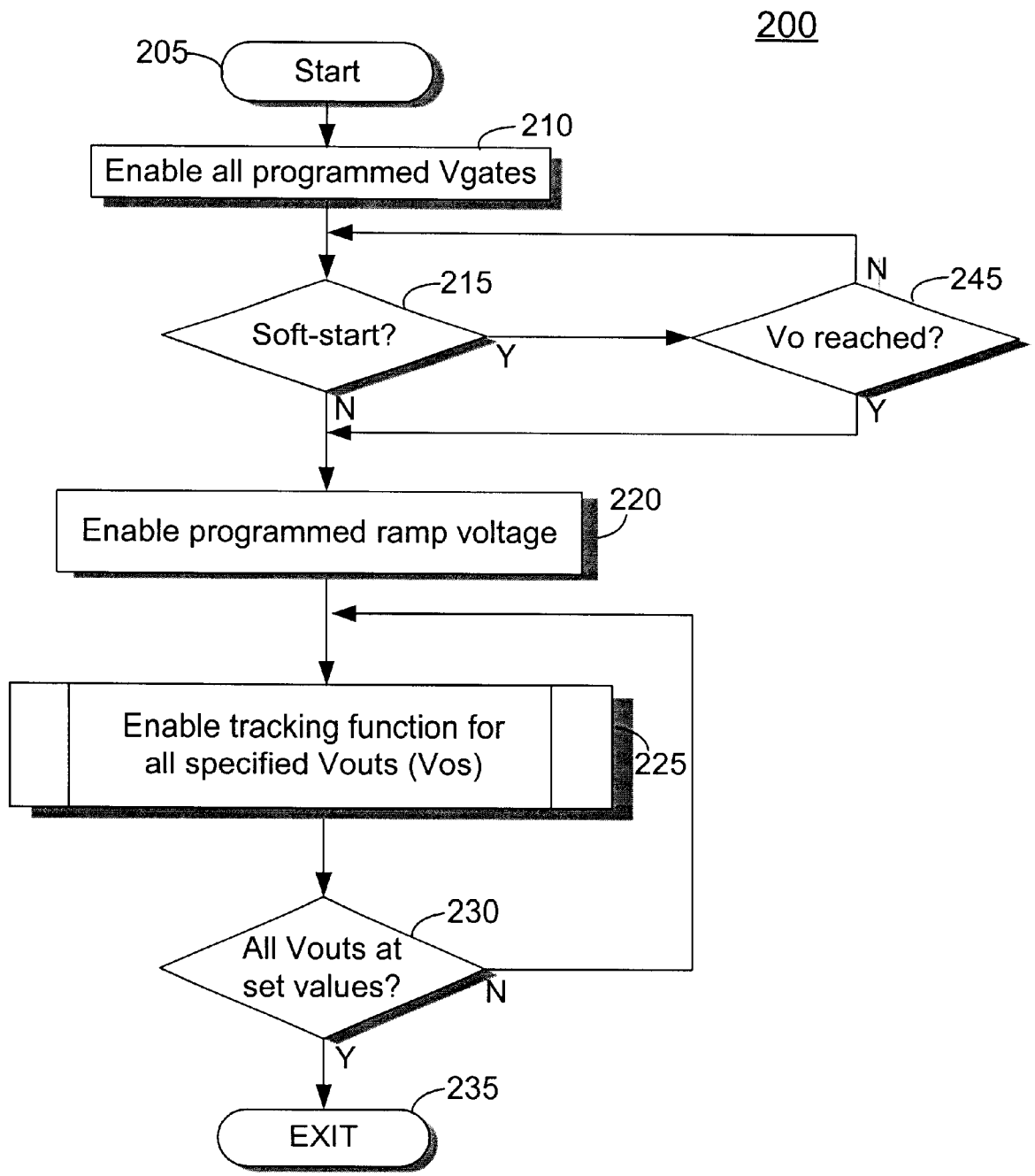
FIG. 2 is a flow diagram illustrating a method for output power-on sequencing and soft-start in accordance with the present invention.

FIG. 2 illustrates a flow diagram of a method 200 for tracking and modifying supply voltages using a tracking device. When necessary, FIG. 1 is referenced in the following discussion of FIG. 2. Specifically, FIG. 2 illustrates the initializing tracking function 225 included within the tracking device, soft-start, and supply monitoring during supply transitions from an on or off state, to a final value.

The method 200 begins when the tracking device is initialized at 205. At 210 the supply control circuits 125A–D are enabled. The method 200 proceeds to 215 to determine if a soft-start of any of the supplies is required. If soft-start is required, the tracking function is not enabled until the supply being soft-started reaches the desired value.

If a soft-start is not required, the method proceeds to step 220 where the programmed ramp voltage from voltage ramp source 125 is activated. The method 200 them proceeds to 225 to activate the tracking function described within the discussion of FIG. 3 below.

At 230 all of the output values of the power supplies are measured to determine if they have all reached their desired values. If the power supplies have all reached their final values, method 200 exits at 235. If the power supplies have not all reached their final values method 200 proceeds to 225.

Figure 3:
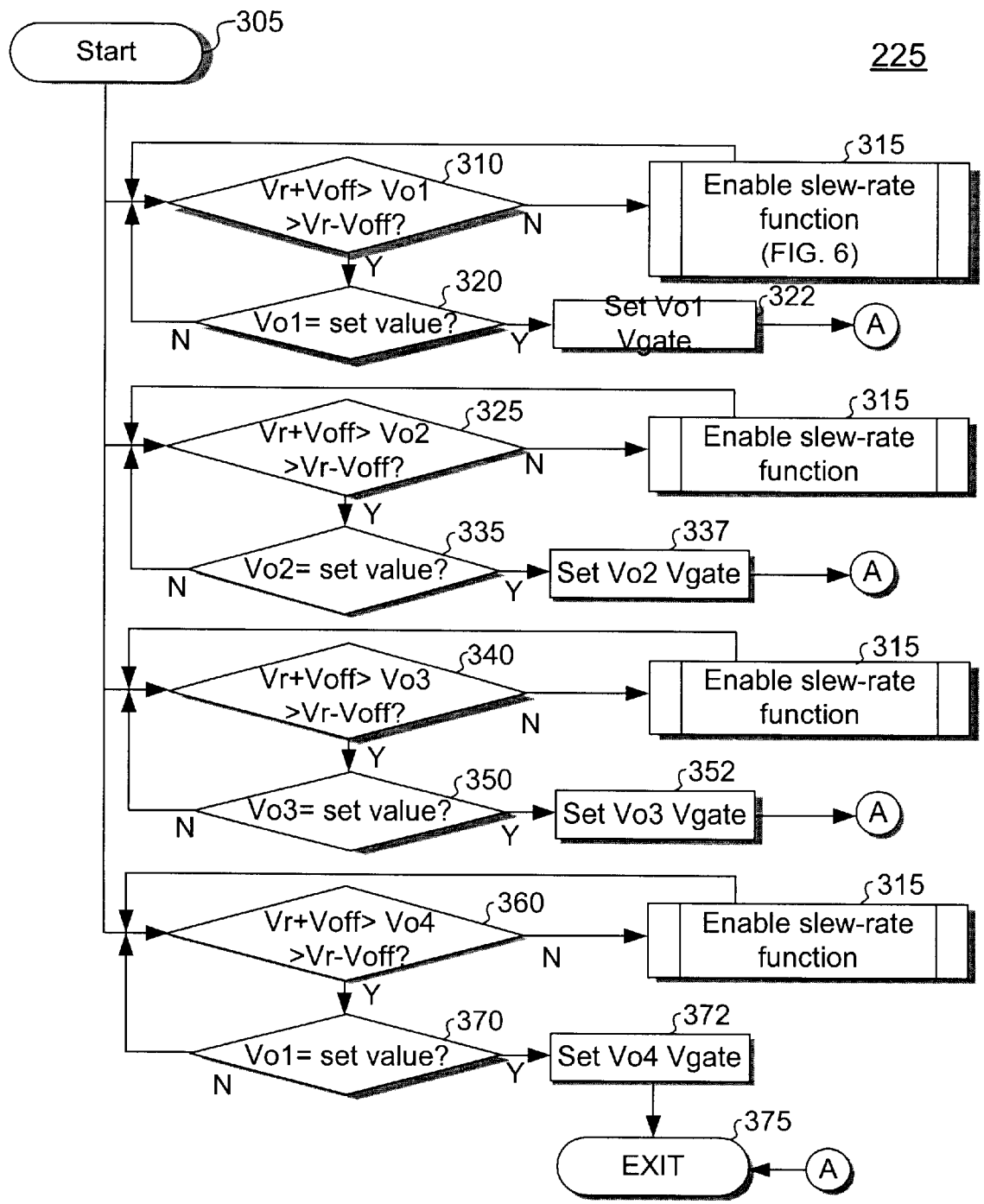
FIG. 3 is a flow diagram illustrating a method for detecting differential voltage and initiating tracking control in accordance with the present invention.

FIG. 3 illustrates a flow diagram of 225 for tracking and controlling supply voltages. When necessary, FIGS. 1 and 2 are referenced in the following discussion of FIG. 3. Specifically, FIG. 3 illustrates the tracking function 225 included within the tracking device as shown in FIG. 1. The tracking function is adapted to: monitor a plurality of input supply voltages during transition to a final value, compare the voltage of each supply against a reference voltage ramp set to a desired slew rate, and maintain each supply within a specified slew rate boundary as defined by the voltage ramp and predetermined offset values.

The method 225 begins when the tracking device is initialized at 305. The tracking function 225 is independent and operates identically for each supply (i.e., Vo1–V04). At 310, the voltage value of Vo1 is compared to the ramp voltage plus Voffset-A and the ramp voltage minus Voffset-B. If the value of Vo1 is less than the ramp voltage plus Voffset-A and greater than the ramp voltage minus Voffset-B the method 225 proceeds to 320. At 320 if Vo1 does not equal the Vo1 final value, the method proceeds to 310. If Vo1 is greater than the ramp voltage plus Voffest-A or less than the ramp voltage minus Voffset-B, method 225 proceeds to 315 to enable the slew rate function illustrated in FIG. 4 discussed below.

The method 225 is identical for each supply being monitored. For example, at 325 (340, 360), the voltage value of Vo2 (Vo3, Vo4) is compared to the ramp voltage plus Voffset-A and ramp voltage minus Voffset-B. If the value of Vo2 (Vo3, Vo4) is less than ramp voltage plus Voffset-A and greater than the ramp voltage minus Voffset-B the method 225 proceeds to 335. If Vo2 (Vo3, Vo4) does not equal the Vo2 (Vo3, Vo4) final value (i.e., the end output voltage), the method proceeds to 325. If Vo2 (Vo3, Vo4) is greater than the ramp voltage plus Voffest-A or less than the ramp voltage minus Voffset-B, method 225 proceeds to 315 to enable the slew rate function discussed in FIG. 4 below.

Figure 4:
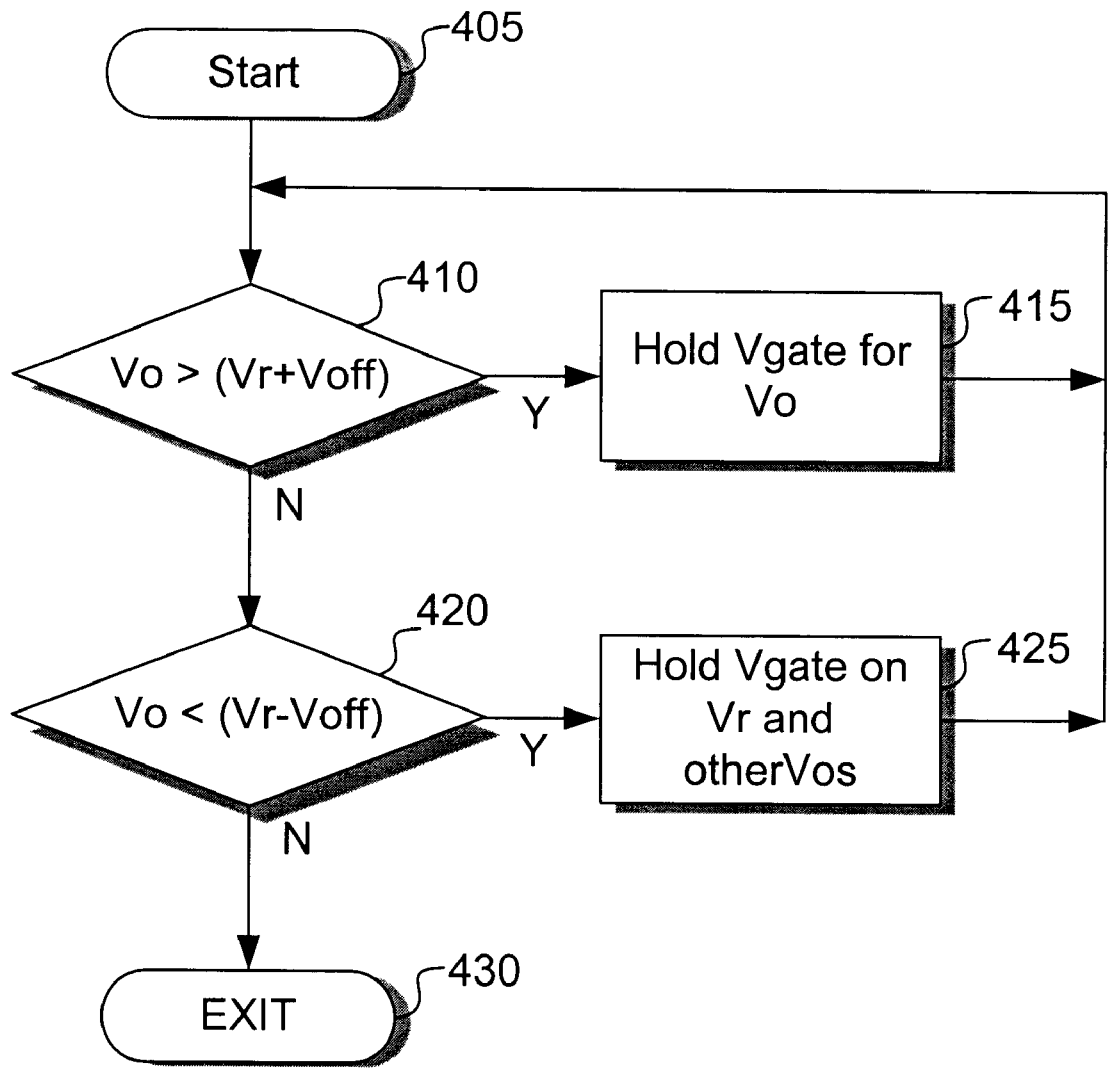
FIG. 4 is a flow diagram illustrating a method for tracking and changing the power supply slew rate in accordance with the present invention.

FIG. 4 illustrates a flow diagram of 315 for tracking and controlling supply voltages and currents. When necessary, FIGS. 1, 2, and 3 are referenced in the following discussion of FIG. 4. Specifically, FIG. 3 illustrates the slew rate function 315 included within the tracking device shown in FIG. 1.

The method 315 begins at 405 when the slew rate function is initialized at 405. At 410 the power supply voltage (e.g., Vo1–Vo4) is compared to the voltage ramp plus Voffset-A. If the value of the power supply is greater than ramp voltage plus Voffset-A, then the supply control circuitry 125A–D is activated and the supply is held constant until the ramp voltage plus Voffset-A is greater than the supply voltage (Vo1–Vo4). If the value of the supply voltage is less than the ramp voltage minus Voffset-B, the method 315 proceeds to 420.

At 420, the power supply voltage (e.g., Vo1) is compared to the voltage ramp minus Voffset-B. For example, if the value of a first supply (e.g., Vo1) is less than the voltage ramp minus Voffset-B, the supply control circuitry 125A–D holds all other supplies being tracked (e.g., Vo2–4) constant until the value of the first power supply (e.g., Vo1) is greater than the voltage ramp minus Voffset-B.

At 420, if the value of the first power supply (e.g., Vo1) is greater than the voltage ramp minus Voffset-B then the method exits at 420 back to the associated comparison step (i.e., 310, 325, 340, or 360) in FIG. 3.

Figure 5:
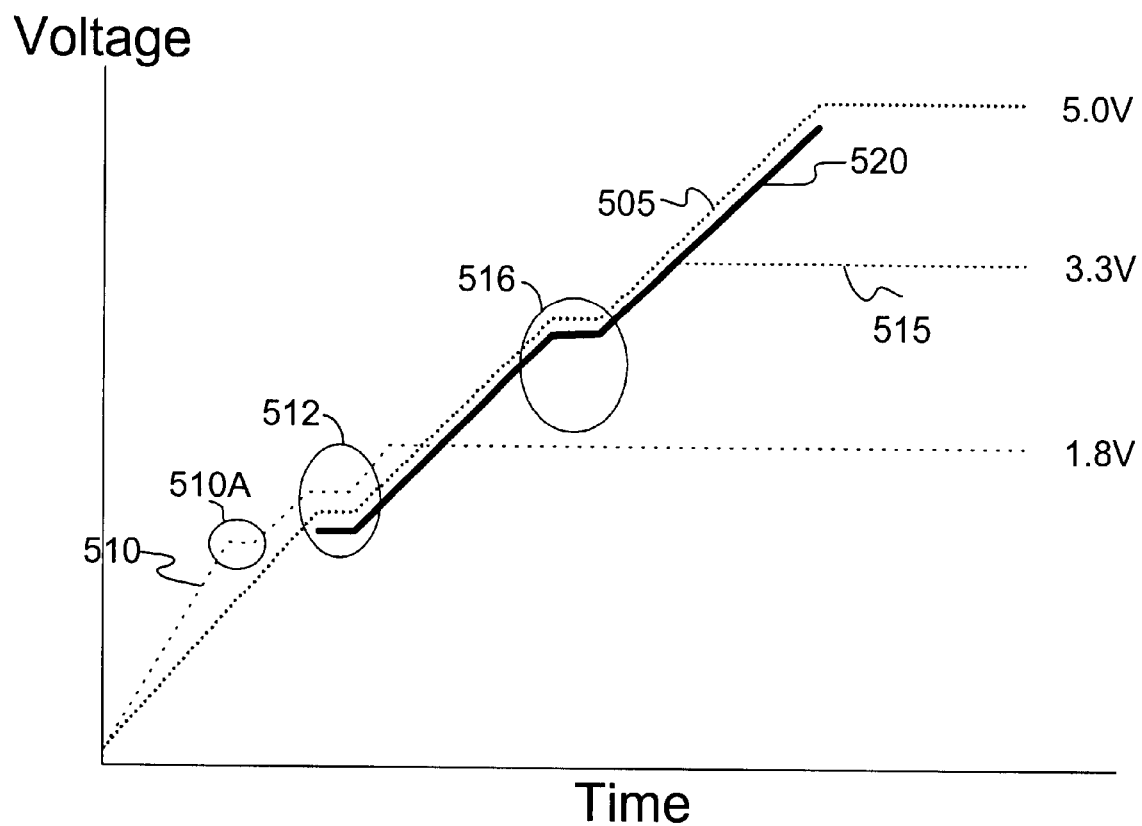
FIG. 5 is an illustration of a power on tracking operation for 3 power supplies during a turn-on state transition.

FIG. 5 is a graphical diagram of the preferred embodiment pertaining to monitoring three power supplies turned on about simultaneously. FIG. 5 illustrates a graph of voltage versus time. Three power supplies, 1.8V supply 510, 3.3V supply 515, and 5V supply 505 are being compared as they are turned on from about 0V against the voltage ramp 520 from voltage ramp source 125 and the preset limits of Voffset-A and Voffset-B.

In the turn on sequence the voltage profile of the 1.8V supply 510 illustrates that the 1.8V power supply is more rapidly moving toward its end value of 1.8V (i.e. has a greater slew rate) than supplies 505, 515, and voltage ramp 520 plus Voffset-A. At 510A the output voltage of the 1.8V supply has exceeded the voltage ramp 520 plus Voffset-A. According to methods 225 and 315 discussed above, the 1.8V power supply is monitored and held constant until voltage ramp 520 supply is within the predefined window of Vramp plus Voffset-A.

The 3.3V voltage supply profile 515 indicates that at 512, voltage supplies 505, 510, and the voltage ramp 520 are being held constant until the 3.3V supply 515 is within voltage ramp 520 minus Voffset-B value.

At 516 only the 3.3V supply and the 5.0V supply are still moving toward their final values of 3.3V and 5.0V respectively. The 1.8V supply has reached its final value of about 1.8V and is no longer being tracked. The 3.3V supply 515 continues to climb, but at 516 exceeds the limit of the voltage ramp minus the Voffset-B. Therefore, using methods 225 and 315 the voltage ramp 520 and the 5.0V supply at 516 are monitored and held constant until the 3.3V supply is greater that the voltage ramp 520 minus Voffset-B.

Figure 6:
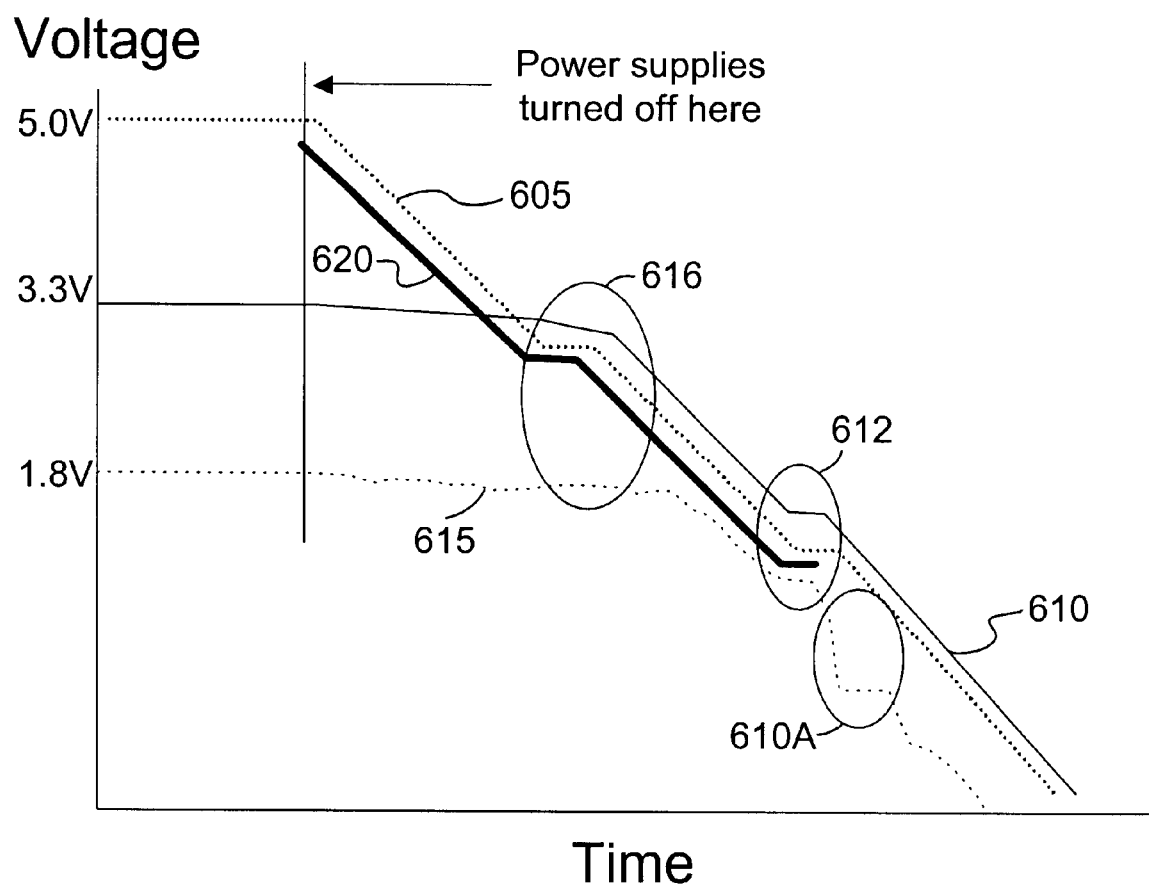
FIG. 6 is an illustration of a power on tracking operation for 3 power supplies during a turn-off state transition.

FIG. 6 is a graphical example of the preferred embodiment pertaining to monitoring three power supplies turned off about simultaneously. FIG. 6 illustrates a graph of voltage versus time. Three power supplies comprising a 1.8V supply 610, 3.3V supply 615, and 5V supply 605 are being turned off from about 1.8V, 3.3V, and 5.0V respectively. The three supplies are being compared to the voltage ramp 620 plus Voffset-A and minus Voffset-B.

At 616 the 3.3V supply 615 is falling-off less rapidly (i.e. lower slew rate) than the. At 616 the 3.3V supply exceeds the value of the voltage ramp plus Voffset-A. Therefore, using methods 225 and 315 the 5.0V supply 605 and the ramp voltage 620 are held constant until the 3.3V supply voltage 610 is less than the voltage ramp 620 plus Voffset-A. When the 3.3V supply voltage 610 is less than the voltage ramp 620 plus Voffset-A, the ramp 620 and 5.0V 605 supply voltage are released to continue to fall-off.

At 612 the 3.3V supply voltage is falling-off less rapidly (i.e. lower slew rate) moving toward its end value of 3.3V than supplies 605, 615, and voltage ramp 620. Therefore, at 512 supply voltages 605, 610, 615 and the voltage ramp 620 are being held constant until the 3.3V supply 610 is within the voltage ramp 520 plus Voffset-A limit.

At 610A the output voltage of the 1.8V supply is falling-off more rapidly than the supply voltages 605, 610, and the voltage ramp 620, and has exceeded the voltage ramp 620 minus Voffset-B limit. According to method 225 and 315, the 1.8V supply 615 is held constant until the 1.8V supply voltage is within the voltage ramp 620 minus Voffset-B limit.

In one alternative embodiment a sample value of voltages or currents may be used as the input to the tracking device to control a plurality of power supplies or conditioning circuits having a much larger positive or negative output power.

Additionally, the power supply control circuitry can comprise of variable power supplies or conditioning circuits having control input adapted to be held constant given a analog or digital signal input.

Figure 7:
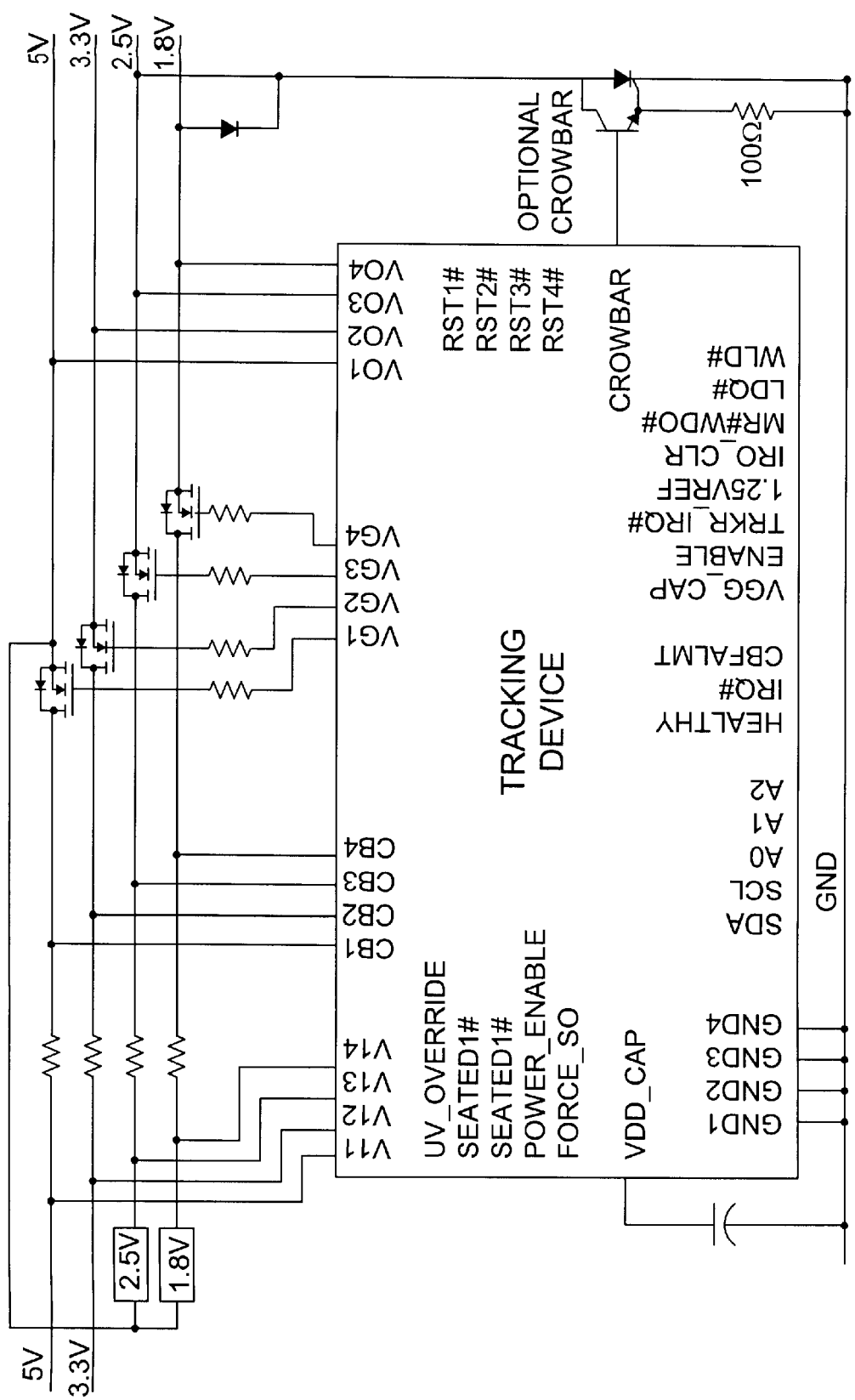
FIGS. 7–8 are circuit diagrams illustrating reference designs using the tracking device in accordance with the present invention.
Figure 8:
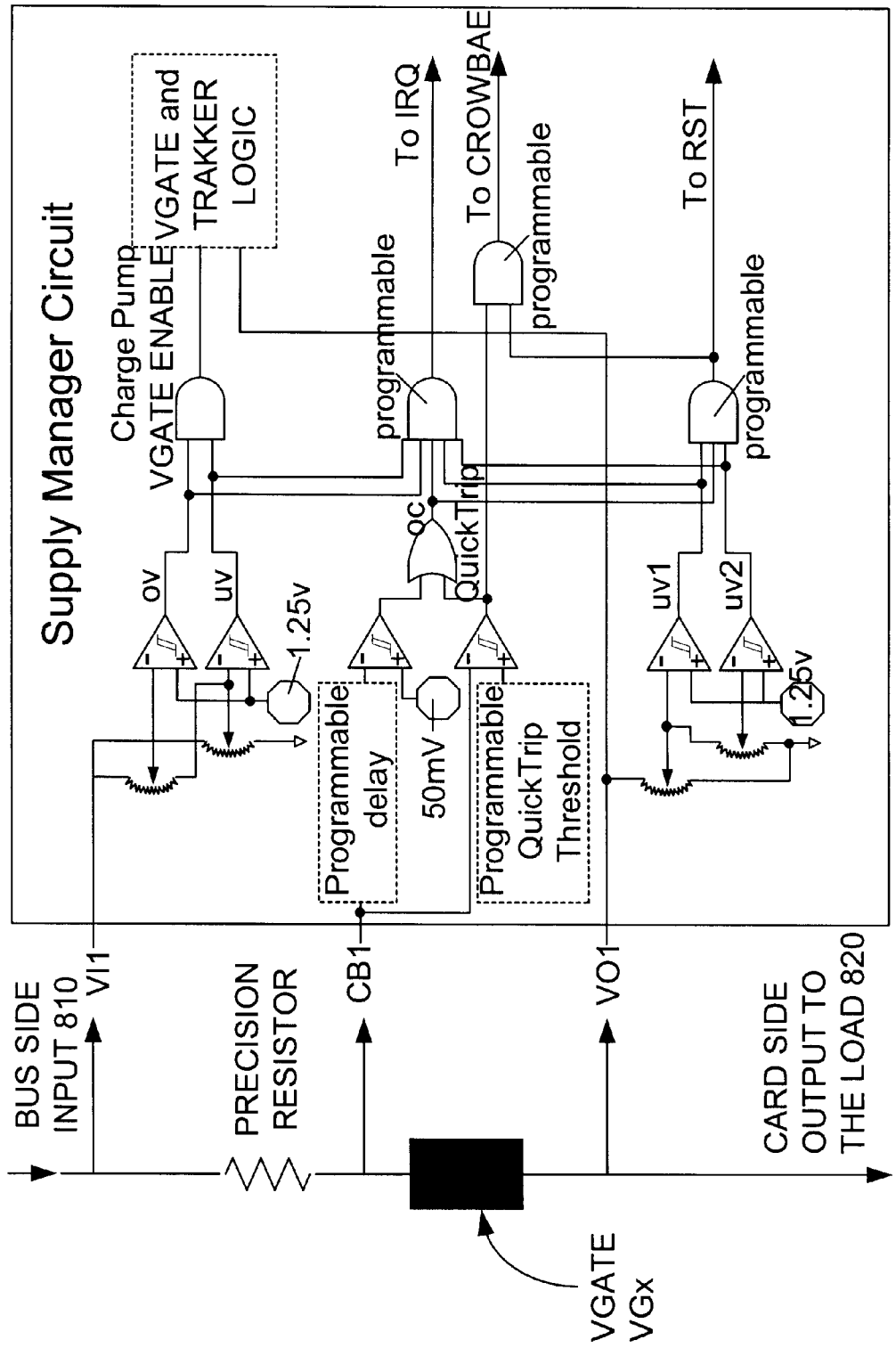

FIGS. 7–8 are circuit diagrams illustrating reference designs using the tracking device in accordance with the present invention. The tracking device is a fully integrated programmable voltage manager integrated circuit, providing supervisory functions and tracking control for up to four independent power supplies. In the embodiment as shown in FIG. 7, the voltages of the power supplies are set at 1.8V, 2.5V, 3.3V, and 5V. The four internal managers perform the following functions: monitor source (bus-side) voltages 810 for under-voltage and over-voltage conditions, monitor each supply for over-current conditions, monitor back end (card-side) voltages 820 for two staged levels of under-voltage conditions, insure power to the card-side logic tracks within the specified parametric limits, and provide supply status information to a host processor.

The tracking device incorporates nonvolatile programmable circuits for setting all of the monitored thresholds for each manager. Individual functions are also programmable allowing interrupts or reset conditions to be generated by any combination of events. The tracking device is also able to store fault conditions when fault conditions occur by using EEPROM technology. In the case of a catastrophic failure the fault is recorded in the registers and then can be read for analysis.

Accordingly, various modifications, adaptations, and combinations of various features of the described embodiments can be practiced without departing from the scope of the invention as set forth in the appended claims.

What is claimed is:

1. A method for tracking and maintaining voltage and current slew-rates between one or more current and voltage supplies during current and voltage transitions, the method comprising:

providing at least a first supply transition;

providing a reference transition having a defined slew-rate;

measuring a difference value between the first supply transition and the reference transition; and keeping the difference value within a specified range by maintaining the first supply transition within a specified differential value from the reference transition.

2. The method of claim 1 further comprising the step of defining an upper and lower limit about the reference transition to establish the specified differential.

3. The method of claim 2 wherein the upper limit is the reference transition plus a first voltage offset and the lower limit is the reference transition minus a second voltage offset.

4. The method of claim 2 further comprising the step of holding the first supply transition at a constant value until the upper limit is greater than the first supply transition.

5. The method of claim 2 further comprising the step of holding the reference transition and other supply transitions within the limit, at a constant value until the first supply transition is greater than the reference transition minus a second voltage offset.

6. The method of claim 1 wherein the first supply transition results from a first supply being activated from a deactivated state.

7. The method of claim 1 wherein the first supply transition results from a first supply being deactivated from an activated state.

8. The method of claim 1 wherein the first supply transition is a change in the supply voltage of a first supply, wherein the difference value is a voltage difference, and wherein the specified differential value is a differential voltage.

9. The method of claim 1 wherein the first supply transition is a change in the supply current of a current supply, wherein the difference value is a current difference, and wherein the specified differential value is a differential current.

10. An apparatus for tracking and maintaining voltage and current slew rates between one or more current and voltage supplies during current and voltage transitions, the apparatus comprising:

a plurality of detection inputs to receive at least one supply transition;

a reference to provide a reference transition having a defined slew-rate;

a measuring logic to measure a difference value between the supply transition and the reference transition; and a control output to keep the difference value within a specified range by maintaining the supply transition within a specified differential value from the reference transition.

11. The apparatus of claim 10 wherein the reference transition plus offset values define an upper and lower limit about the reference transition to establish the specified differential value.

12. The apparatus of claim 11 wherein the upper limit is the reference transition plus a first voltage offset and the lower limit is the reference transition minus a second voltage offset.

13. The apparatus of claim 12 wherein the control output holds the first supply transition at a constant value until the upper limit is greater than the supply transition.

14. The apparatus of claim 12 wherein the reference transition and other supply transitions within the upper and lower limit are held at a constant value until the first supply transition is greater than the reference transition minus a second voltage offset.

15. The apparatus of claim 11 wherein the supply transition results from a first supply being activated from a deactivated state.

16. The apparatus of claim 11 wherein the supply transition results from a first supply being deactivated from an activated state.

17. The apparatus of claim 11 wherein the supply transition is a change in the first supply voltage, wherein the difference value is a voltage difference, and wherein the differential value is a differential voltage.

18. The apparatus of claim 11 wherein the supply transition is a change in the first supply current, wherein the difference value is a current difference, and wherein the differential value is a differential current.

* * * * *